(12) United States Patent
Schlachter et al.

(10) Patent No.: US 9,535,138 B2
(45) Date of Patent: Jan. 3, 2017

(54) ELECTRONIC DEVICE AND METHOD FOR START-UP OF AN ELECTRONIC DEVICE

(75) Inventors: Marc Schlachter, Wehr (DE); Roland Dieterle, Pfaffenhofen (DE); Romuald Girardey, Huningue (FR)

(73) Assignee: Endress + Hauser GmbH + Co. KG, Maulburg (DE)

( * ) Notice: Subject to any disclaimer, the term of this patent is extended or adjusted under 35 U.S.C. 154(b) by 828 days.

(21) Appl. No.: 13/881,482

(22) PCT Filed: Aug. 25, 2011

(86) PCT No.: PCT/EP2011/064664
§ 371 (c)(1),
(2), (4) Date: Apr. 25, 2013

(87) PCT Pub. No.: WO2012/055604
PCT Pub. Date: May 3, 2012

(65) Prior Publication Data
US 2013/0221759 A1 Aug. 29, 2013

(30) Foreign Application Priority Data
Oct. 27, 2010 (DE) .......... 10 2010 043 026

(51) Int. Cl.
*H01H 35/00* (2006.01)
*G01R 33/07* (2006.01)
(Continued)

(52) U.S. Cl.
CPC .......... *G01R 33/07* (2013.01); *G01B 7/14* (2013.01); *H01H 36/00* (2013.01); *H03K 17/95* (2013.01); *H03K 17/97* (2013.01); *Y10T 307/766* (2015.04)

(58) Field of Classification Search
CPC ........ H01H 35/00; H01H 83/00; G01R 33/07; H03K 17/95; G01B 7/14
(Continued)

(56) References Cited

U.S. PATENT DOCUMENTS 4,652,821 A 3/1987 Kreft
4,698,996 A 10/1987 Kreft et al.
(Continued)

FOREIGN PATENT DOCUMENTS

DE 32 44 891 A1 6/1984
DE 34 43 176 C1 12/1985
(Continued)

OTHER PUBLICATIONS

German Search Report dated Jan. 26, 2011, issued in Application No. 10 2010 043 026.9, in Munich, Germany.
(Continued)

*Primary Examiner* — Rexford Barnie
*Assistant Examiner* — Joseph Inge
(74) *Attorney, Agent, or Firm* — Bacon & Thomas, PLLC

(57) ABSTRACT

An electronic device, comprising" a housing; a magnetic element guideway, the guideway enables positioning of an accommodated magnetic element in at least two magnetic element positions relative to the housing. A control and evaluation circuit in a chamber with two Hall sensors for registering at least one component of a first local magnetic and for providing, a signal, which depends on the local magnetic field registered at the first site. The two Hall sensors have relative to the housing a defined position, wherein the control circuit is suitable based on the signals to detect whether a magnetic element is present in the gateway, and in case yes, based on at least one of the two signals, to
(Continued)

detect whether the magnetic element is located in the first defined magnetic element position or has been moved from this position.

10 Claims, 4 Drawing Sheets

(51) Int. Cl.
*H01H 36/00* (2006.01)
*H03K 17/97* (2006.01)
*G01B 7/14* (2006.01)
*H03K 17/95* (2006.01)

(58) Field of Classification Search
USPC ........................................ 307/116; 324/207.2
See application file for complete search history.

(56) References Cited

U.S. PATENT DOCUMENTS

| | | | |
|---|---|---|---|
| 5,201,838 A * | 4/1993 | Roudaut | B25J 13/088 294/206 |
| 5,278,543 A | 1/1994 | Orth et al. | |
| 6,323,641 B1 * | 11/2001 | Allwine | G01D 5/145 324/207.2 |
| 6,633,157 B1 * | 10/2003 | Yamaki | F01L 9/04 123/90.11 |
| 7,423,421 B2 | 9/2008 | Reichert et al. | |
| 2001/0015642 A1 * | 8/2001 | Fischer | G01D 5/145 324/207.2 |
| 2006/0208724 A1 * | 9/2006 | Reichert | F15B 15/10 324/207.2 |
| 2007/0290677 A1 * | 12/2007 | Christianson | F16K 37/0033 324/207.2 |
| 2009/0008583 A1 | 1/2009 | Grethel | |

FOREIGN PATENT DOCUMENTS

| | | |
|---|---|---|
| DE | 43 39 827 C2 | 6/1995 |
| DE | 297 16 805 U1 | 12/1997 |
| DE | 10 2004 036 324 A1 | 2/2006 |
| DE | 10 2005 007 561 B4 | 8/2006 |
| DE | 10 2006 036 696 A1 | 2/2008 |
| DE | 10 2007 007 087 B4 | 8/2008 |
| WO | 2005/038350 A1 | 4/2005 |
| WO | 2007/076750 A1 | 7/2007 |

OTHER PUBLICATIONS

International Preliminary Report on Patentability dated Nov. 28, 2011, issued in Application No. PCT/EP2011/064664, in Rijswijk, Netherlands.

International Preliminary Report on Patentability dated May 10, 2013, issued in Application No. PCT/EP2011/064664, in Geneva, Switzerland.

* cited by examiner

ELECTRONIC DEVICE AND METHOD FOR START-UP OF AN ELECTRONIC DEVICE

TECHNICAL FIELD

The present invention relates to an electronic device and to a method for start-up of an electronic device. Such electronic devices can be, for example, measurement transmitters of industrial process measurements technology, which register process parameters, such as pressure, fill level, temperature, flow, pH or other analytical variables by means of a corresponding sensor, and condition a measurement signal of the sensor and provide such in suitable manner to a control system, for example, in the form of an electrical current signal, especially one between 4 and 20 mA, or in the form of a digital signal in one of the established fieldbus formats, for example, PROFIBUS, FOUNDATION FIELDBUS or HART.

BACKGROUND DISCUSSION

Insofar as such measurement transmitters are often applied under adverse environmental conditions, one attempts to prevent breaks in the housings of the measurement transmitters, since, through such breaks, corrosive or explosive media could penetrate into the housing of the measurement transmitter. Thus, interacting with the measurement transmitters via keys with galvanic contacts and switches is limited. In order nevertheless to enable interaction with measurement transmitters, for example, buttons with a magnetic element are used, which have defined positions relative to the measurement transmitter and are movable, in order with their magnetic fields to actuate corresponding magnetic switches or Hall sensors in the interior of the housing.

Thus, Offenlegungsschrift (laid open application) DE102004036324 A1 discloses a magnetic switch for a measurement transmitter, in the case of which a support body, which contains a magnetic element in asymmetric position, can be inserted in different orientations into a blind hole, which borders the inner space of a housing, wherein, depending on the orientation of the magnetic element in the blind hole, a Hall-sensor in the interior of the housing is influenced differently by the magnetic element. By selection of the orientation of the magnetic element, one of two manners of operation of the measurement transmitter can be selected.

European Patent EP0 383 823 B1 discloses a measurement transmitter, in the case of which zero-point and slope can be set by means of magnetic switches, wherein each of the magnetic switches has a magnet, which is movable in a blind hole, in order to actuate a reed-contact arranged in an electronics housing of the measurement transmitter and positioned in the vicinity of the wall of the blind hole.

With reference to platform concepts, it can, however, be quite advantageous to offer simple device variants without magnetic switches, when the interactive functions resulting from the magnetic switches are not required.

In this case, however, attention must be paid that not using the magnetic elements still leaves operation of the electronic device with a standardized electronic circuit possible, that, thus, a control- and evaluation circuit is suitable to function reliably in both variants of an electronic device. This means in particular that the circuit is able to detect the presence of a magnet and to distinguish from magnetic disturbance fields arising in given cases. It is, therefore, an object of the present invention to provide an electronic device and a method for its start-up, wherein the electronic device can be operated reliably both with magnet switches as well as also without magnetic switches.

SUMMARY OF THE INVENTION

The object of the invention is achieved by the electronic device which includes: a housing, which has at least one chamber in its interior; a magnetic element guideway for accommodating and guiding a magnetic element, wherein the magnetic element guideway enables positioning of an accommodated magnetic element in at least two defined magnetic element positions relative to the housing; a control and evaluation circuit, which is arranged in the chamber and has a first Hall sensor for registering at least one component of a first local magnetic field at the site of the first Hall sensor and for providing a first signal, which depends on the local magnetic field registered at the first site, wherein the first Hall sensor has a first defined position relative to the housing; and a second Hall sensor for registering at least one component of a second local magnetic field at the site of the second Hall sensor and for providing a second signal, which depends on the local magnetic field registered at the second site, wherein the second Hall sensor has a second defined position relative to the housing; wherein the control circuit is suitable based on the first signal and based on the second signal or based on state variables derived from the signals to detect, whether a magnetic element is present in the magnetic element guideway and, in case yes, based on a signal of a state variable derived therefrom or based on both signals, or therefrom derived state variables, to detect whether the magnetic element is located in the first defined magnetic element position or, for example, by actuation in the magnetic element guideway, has been moved from this position, especially by at least one reference value.

The reference value can be, for example, at least about a fourth of the distance, especially at least a half of the distance, and furthermore at least three fourths of the distance between the first and second positions of the magnetic element.

In a further development of the invention, it can especially be detected whether the magnetic element is located in the first defined magnetic element position, or in the second defined magnetic element position.

In a further development of the invention, the magnetic element guideway comprises a blind hole in the housing, wherein the first defined magnetic element position is spaced in longitudinal direction of the blind hole from the second defined magnetic element position.

In an embodiment of this further development of the invention, the first Hall sensor is positioned to register a component of the magnetic field, which extends essentially perpendicularly to the longitudinal direction of the blind hole.

In an additional embodiment of this further development of the invention, the second Hall sensor is positioned to register a component of the magnetic field, which extends essentially perpendicularly to the longitudinal direction of the blind hole, wherein the value of the component of the local magnetic field registered with the first Hall sensor has especially an opposite sign to that of the value of the component of the local magnetic field registered with the second Hall sensor, when a magnetic element is located in the magnetic element guideway, and when the magnetic element is positioned in a first defined magnetic element position (a).

In a further development of the invention, the magnitude of a ratio R of a signal sum to a signal difference of signals $S_1$, $S_2$ of the Hall sensors, which represent the components measured, in each case, by the first and second Hall sensors, is given by the following expression:

$$R:=|(S_1+S_2)|/(|S_1|+|S_2|)<m,$$

wherein m<0.4, especially m<0.2, preferably m<0.1, when a magnetic element is located in the magnetic element guideway, and when the magnetic element is positioned in a first defined magnetic element position (a). The control and evaluation circuit can furthermore have an input for receipt of the signals $S_1$, $S_2$ of the first and second Hall sensors and, for example, in the case of an analog evaluation of the signals, be adapted to detect the presence of a magnetic element in the first defined magnetic element position, when R<m.

In another further development of the invention, the control and evaluation circuit includes an input for receipt of the signals $S_1$, $S_2$ of the first and second Hall sensors and a discriminator circuit for mapping the signals $S_1$, $S_2$ of the Hall sensors onto defined state values $Z_1$, $Z_2$, which can, in each case, assume a value from the set {−1; 0; +1}, and wherein the control and evaluation circuit is adapted to detect the presence of a magnetic element in the first defined magnetic element position, when $Z_1 \neq Z_2$.

In an embodiment of this further development of the invention, the defined state values $Z_1$, $Z_2$ can, in each case, assume only a value from the set {0; 1}, wherein the control and evaluation circuit is adapted to detect the presence of a magnetic element in the first defined magnetic element position, when ($Z_1$=0 and $Z_2$=1) or ($Z_1$=1 and $Z_2$=0).

In a further development of the invention, the separation d of the first Hall sensor from the second Hall sensor in the direction of movement in the magnetic element guideway is: d>l/4, especially d>l/2, and preferably d>l/2l, wherein l is the length of the magnetic element in the direction of movement in the magnetic element guideway.

In a further development of the invention, the electronic device includes a measurement transmitter for registering a process measurement variable, such as pressure, fill level, temperature, flow, pH-value, conductivity, turbidity, concentration of dissolved oxygen, an analytical global parameter, such as total organic carbon, or another property of a process medium.

The method of the invention for start-up of an electronic device, which can be interacted with by means of a magnetic element, and which has magnetic field sensors for registering the magnetic field of the magnetic element, includes steps as follows:
checking whether a magnetic element is present based on one or more of the signals $S_1$,$S_2$ of the magnetic field sensors or based on digital state variables $Z_1$,$Z_2$ derived therefrom; and
either operating the electronic device in a first mode, which is not influenceable by the magnetic element, in case no magnetic element was detected;
or operating the electronic device in a second mode, which is influenceable by the magnetic element, in case a magnetic element was detected.

BRIEF DESCRIPTION OF THE DRAWINGS

The invention will now be explained based on the example of an embodiment presented in the drawing, the figures of which show as follows.

DETAILED DISCUSSION IN CONJUNCTION WITH THE DRAWINGS

Figure 1A:
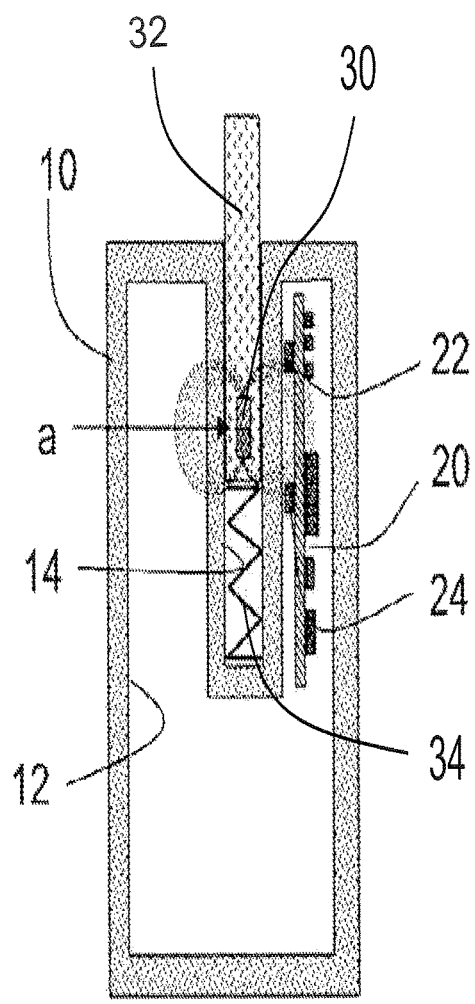
FIG. 1a is a longitudinal section through an example of an embodiment of an electronic device of the invention with a magnetic switch in a first position.
Figure 1B:
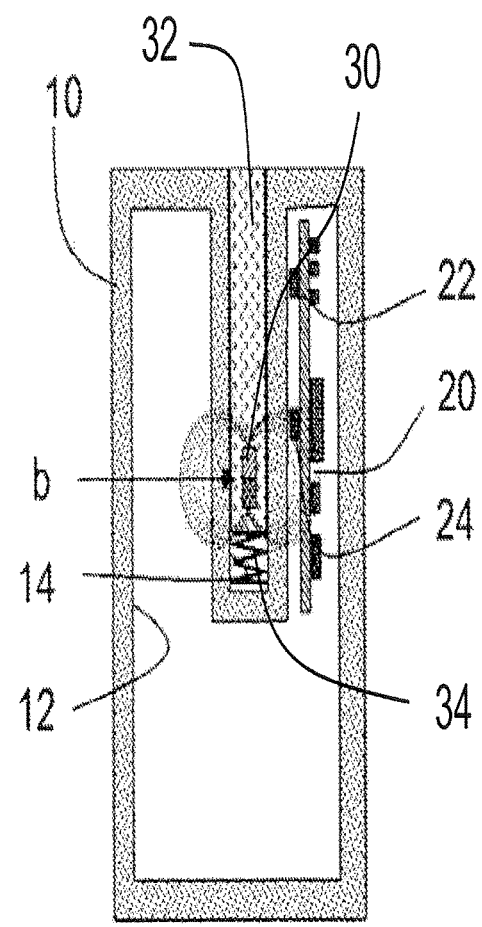
FIG. 1b is a longitudinal section through the device of FIG. 1a with the magnetic switch in a second position.

The, electronic device shown in FIGS. 1a and 1b includes a housing 10, which has in its interior a chamber 12, wherein in a wall of the housing 10 a blind hole 14 is provided, which is accessible from outside of the housing. Arranged bordering on a wall of the blind hole in chamber 12 is a control and evaluation circuit 20, which controls the electronic device and evaluates signals of a magnetic interaction apparatus explained in greater detail below, for which purpose the evaluation circuit arrangement 20 has two Hall sensors, which are arranged spaced from one another in the longitudinal direction of the blind hole 14. In the blind hole 14, which serves as a magnetic element guideway, a magnetic element 30, which is embedded in a button 32, can be moved against the bias of a return spring 34 between a rest position a and a depressed position b.

Figure 2:
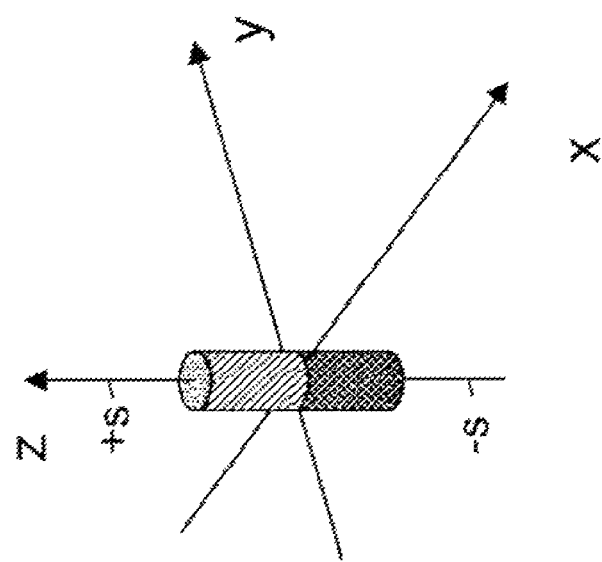
FIG. 2 is a coordinate system for description of the present invention.

A currently preferred variant for orientation of the two Hall sensors 22, 24 will now be described based on FIG. 2. The magnetic element 30 can be moved in the blind hole 14 with its longitudinal axis in the Z-direction, wherein the longitudinal axis and the field axis of the magnetic element 30 are oriented parallel to the Z-axis and pass through X=0 and Y=0. The Hall sensors are positioned, for example, at X=0, Y=1 and Z=+/−s. When the Hall sensors in this arrangement are operated with an electrical current in the Z-direction and the Hall-voltage is registered in the X-direction, then this permits determining of the field component of the magnetic field of the magnetic element 30 in Y-direction. For the case, in which the magnetic element relative to its Z-coordinate is positioned at the origin, thus exactly in the middle between the two Hall sensors, this means that the detected Y-component of the magnetic field at the first Hall sensor 22 corresponds to the negative value of the Y-component of the magnetic field at the second Hall sensor 24. If, now, no magnet were present, and an external magnetic field would act on the electronic device, then it would be practically impossible that the Y-component of the magnetic field at the site of the first sensor has the negative value of the Y-component of the magnetic field at the site of the second sensor. In this way, in the case of the presence of a magnetic field, it can be safely decided whether the magnetic field is caused by a magnetic element in the blind hole or by an external field source.

Figure 3A:
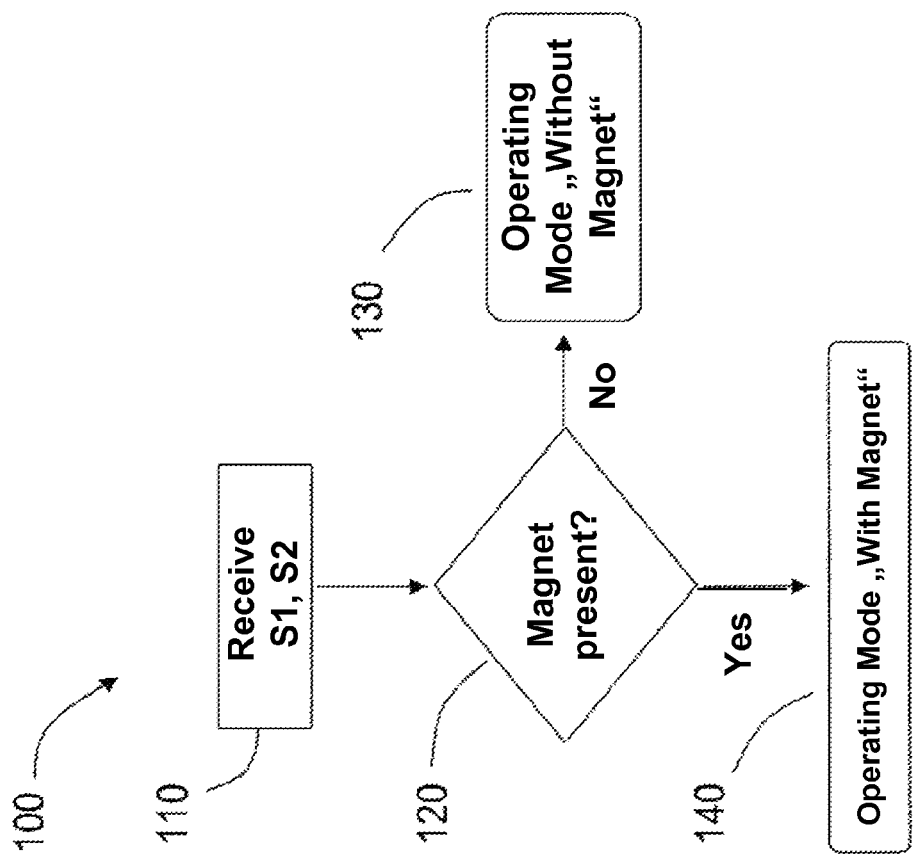
FIG. 3a is a flow diagram for start-up of an electronic device of the invention.
Figure 3C:
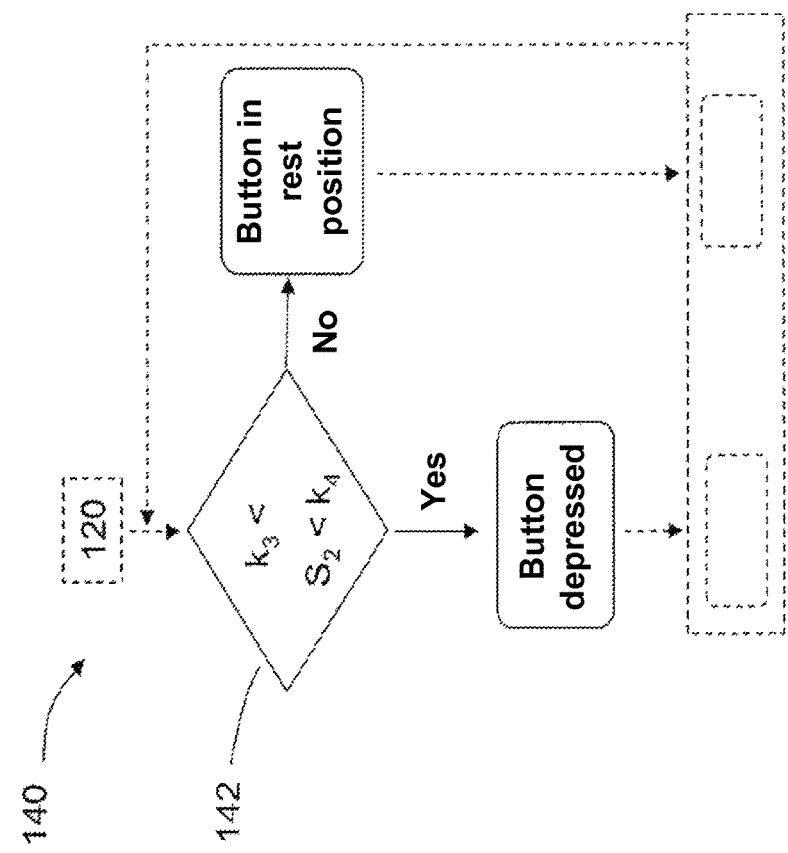
FIG. 3c is a flow diagram for operating the electronic device, when a magnet is present.
Figure 3B:
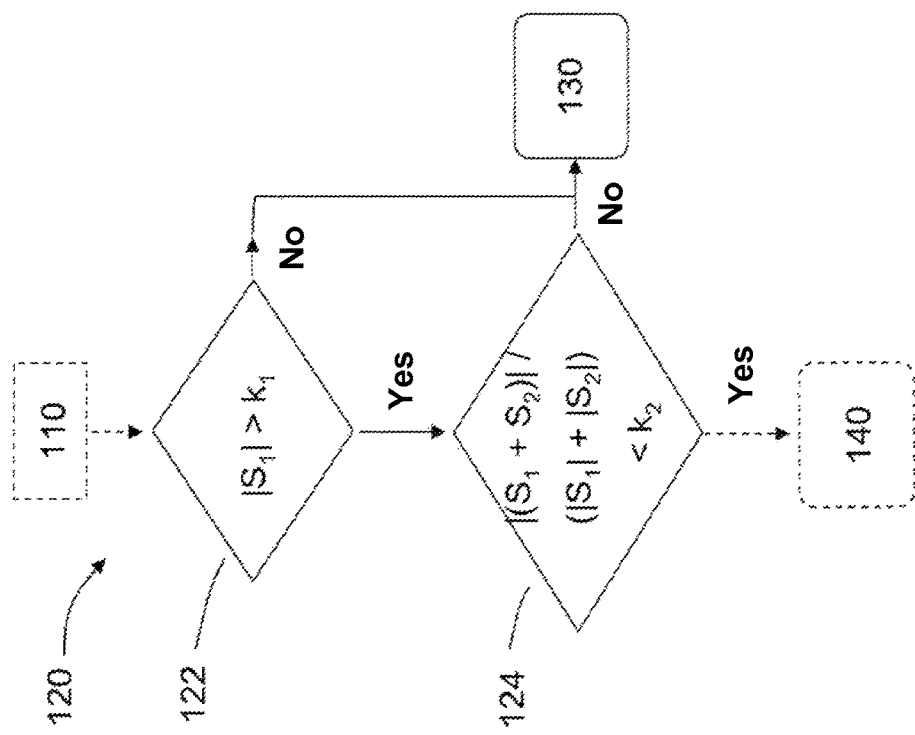
FIG. 3b is a flow diagram for finding out whether a magnet is present.

FIGS. 3a, 3b and 3c illustrate a method 100 for start-up of the electronic device, wherein, in a first method step 110, the signals S1, S2 of the Hall sensors are received and in a next step 120, based on the signals, it is decided, whether a magnetic element is present in the blind hole 14. In case yes, the electronic device enters in a next step 140 an operating mode "with magnet". In this operating mode, the electronic device evaluates the sensor signals S1, S2 further, in order to detect control commands given via the button 32. In case, in the start-up, no magnet is recognized, the electronic device enters the operating mode "without magnet", after which signals S1, S2 of the Hall sensors are no longer evaluated.

FIG. 3b explains the evaluation 120 for determining, whether a magnet is present, for an analog evaluation of the signals S1, S2 of the two Hall sensors. In the case of this evaluation, it is first assumed that the magnetic element, to the extent that it is present, is located in a rest position, in which its magnetic field is detectable by the first Hall sensor and leads to a signal, which exceeds its threshold value $K_1$. In case such a minimum size of the field is not detectable, it can be directly assumed therefrom that no magnetic element is present and the electronic device goes immediately into the operating mode 130 "without magnet". In case, however, the sensor S1 registers a sufficiently strong signal, a second step 124 is used to clarify whether it involves, in such case, a disturbance or actually the field of an intentionally provided, magnetic element. For this, the sum of the signals of the first sensor and of the second sensor S1 and S2 is divided by the difference between these signals.

Figure 4:
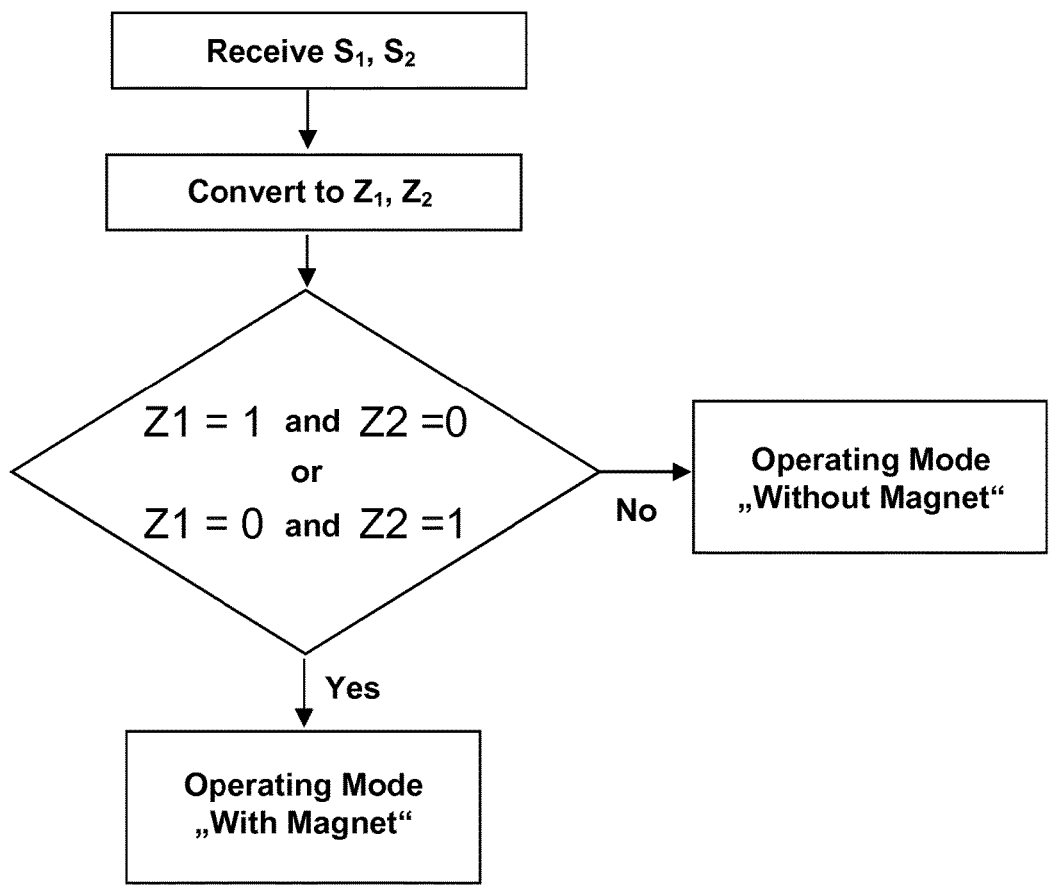
FIG. 4 is a flow diagram for a binary query whether a magnet is present.

Insofar as the signals in the case of a properly provided magnetic element would have opposite sign, this means that the test result in the case of an ideally positioned magnetic element would have the value 0. Insofar as this is technically scarcely implementable with the required accuracy, there occurs here a threshold comparison with a constant $k_2$. When $k_2$ is subceeded, it can be assumed therefrom that a magnetic element is properly present, and the electronic device enters the operating mode 140 "magnet present". In case the constant $k_2$ is exceeded, the electronic device enters the operating mode 130 "without magnet". FIG. 3c shows, finally, a schema for checking the position of the magnetic element 30 integrated in the button 32. In a step 142, it is determined whether the signal S2 of the second sensor has a value between a third constant and a fourth constant, this being the case, when the magnetic element has been moved into the blind hole. In this case, the evaluating circuit detects the state, button actuated. In case the signal lies outside of the interval $[k_3, k_4]$, the evaluating circuit establishes that the button is in its rest position (a). Finally, FIG. 4 shows a digital evaluation of whether a magnetic element is present in the blind hole. For this, the signals S1, S2 of the two Hall sensors are first converted into binary state values $Z_1$, $Z_2$, which are then fed to an evaluation, wherein the presence of a magnet is detected, when $Z_1=1$ and $Z_2=0$ or $Z_1=0$ and $Z_2=1$. Corresponding to what is determined, the operating mode "with magnet" or the operating mode "without magnet" is selected.

The mapping specification for the firstly possibly antisymmetric signals $S_1$ and $S_2$ onto the values 1 and 0 can, in particular, require the addition of a constant and a threshold evaluation. This is, however, known to those skilled in the art and does not need to be explained here in detail.

The invention claimed is:

1. An electronic measurement transmitter configured to register a process parameter selected from pressure, fill level, temperature, flow pH-value, conductivity, turbidity, concentration of dissolved oxygen, or an analytical global parameter by means of a corresponding sensor, comprising:
   a magnetic element guideway for accommodating and guiding a magnetic element, wherein the magnetic element guideway enables positioning of an accommodated magnetic element in at least two defined magnetic element positions relative to the housing,
   wherein said magnetic element guideway comprises a blind hole in said housing; and the first defined magnetic element position is spaced in the longitudinal direction of said blind hole from the second defined magnetic element position, wherein the blind hole is provided in a wall of the housing and is accessible from outside of the housing;
   a controller, which is arranged in the chamber bordering on a wall of the blind hole in said chamber and has a first Hall sensor for registering at least one component of a first local magnetic field at the site of said first Hall sensor and for providing a first signal, which depends on the local magnetic field registered at the first site, wherein the first Hall sensor has a first defined position relative to the housing; and
   a second Hall sensor for registering at least one component of a second local magnetic field at the site of said second Hall sensor and for providing a second signal, which depends on the local magnetic field registered at the second site, wherein the second Hall sensor has a second defined position relative to the housing, wherein:
   said controller is configured to detect whether or not a magnetic element is present in said magnetic element guideway, based on the first signal, or based on a first digital state variable derived therefrom, and based on the second signal, or based on a second digital state variable derived therefrom,
   said controller is configured to operate the electronic measurement transmitter in a first mode, which is not influenceable by a magnetic element in case no magnetic element was detected during a start-up of the electronic measurement transmitter; and
   to operate the electronic measurement transmitter in a second mode, which is influenceable by the magnetic element, in case a magnetic element was detected, and
   to detect in the second mode, based on one of the signals or both signals, or a digital state variable or both digital state variables, whether the magnetic element is located in the first defined magnetic element position or has been moved from this position, particularly by at least one reference value.

2. The electronic measurement transmitter as claimed in claim 1, wherein:
   The second Hall sensor is positioned to register a component of the magnetic field, which extends perpendicularly to the longitudinal direction of said blind hole.

3. The electronic measurement transmitter as claimed in claim 1, wherein:
   The second Hall sensor is positioned to register a component of the magnetic field, which extends perpendicularly to the longitudinal direction of said blind hole.

4. The electronic measurement transmitter as claimed in claim 1, further comprising:
   said magnetic element, wherein:
   the polarity of the component of the local magnetic field registered with the first Hall sensor is opposite to the polarity of the component of the local magnetic field registered with the second Hall sensor, when said magnetic element is located in said magnetic element guideway, and when said magnetic element is positioned in said first defined magnetic element position.

5. The electronic measurement transmitter as claimed in claim 3, wherein:
the magnitude of a ratio R of a signal sum to a signal difference of signals of the Hall sensors, which represent the components measured, in each case, by the first and the second Hall sensors, is given by the following expression:

$$R := |(S_1+S_2)|/(|S_1|+|S_2|) < m,$$

wherein $m \leq 0.4$.

6. The electronic measurement transmitter as claimed in claim 4, wherein:
said controller includes an input for receipt of the signals of the first and second Hall sensors, and is adapted to detect the presence of said magnetic element in the first defined magnetic element position, when $R<m$.

7. The electronic measurement transmitter as claimed in claim 1, wherein:
said controller includes an input for receipt of the signals of the first and second Hall sensors and a discriminator circuit configured for mapping the signals of the Hall sensors onto defined state values, from a set comprising state values $\{-1; 0; +1\}$; and
said controller is adapted to detect the presence of a magnetic element in the first defined magnetic element position, when a state value $Z_1 \neq Z_2$ of the first Hall sensor is not equal to a state value $Z_2$ of the second Hall sensor.

8. The electronic measurement transmitter as claimed in claim 1, wherein:
said controller includes an input for receipt of the signals of the first and second Hall sensors and a discriminator circuit configured for mapping the signals of the Hall sensors onto defined state values a set comprising state values $\{0; 1\}$; and said controller is configured to detect the presence of said magnetic element in the first defined magnetic element position, when a state value $Z_1$ of the first Hall sensor is not equal to a state value $Z_2$ of the second Hall sensor.

9. The electronic measurement transmitter, as claimed in claim 1,
further comprising a magnetic element located in said magnetic element guideway, said magnetic element having a length l in the direction of movement in said magnetic element guideway, wherein:
a separation d of the first Hall sensor from the second Hall sensor in the direction of movement in said magnetic element guideway is: given as:
$d > \frac{1}{4}$.

10. The electronic measurement transmitter, as claimed in claim 8, wherein $d > \frac{1}{2}$.

* * * * *